United States Patent [19]

Soth

[11] Patent Number: 5,020,959

[45] Date of Patent: Jun. 4, 1991

[54] ADJUSTABLE SHUTTER FOR CONTAINMENT OF ELECTRICAL COMPONENTS IN TAPE FEEDERS

[75] Inventor: Henry J. Soth, Brackney, Pa.

[73] Assignee: Universal Instruments Corporation, Binghamton, N.Y.

[21] Appl. No.: 598,762

[22] Filed: Oct. 15, 1990

Related U.S. Application Data

[63] Continuation-in-part of Ser. No. 337,856, Apr. 14, 1989, abandoned.

[51] Int. Cl.⁵ .............................. B65G 65/00
[52] U.S. Cl. ..................... 414/416; 29/759; 221/25; 221/81; 221/211
[58] Field of Search ............ 414/416; 221/74, 79, 221/81, 211, 220, 25; 198/468.4; 29/759

[56] References Cited

U.S. PATENT DOCUMENTS

| | | | |
|---|---|---|---|
| 3,300,089 | 1/1967 | Clute | 221/220 |
| 3,618,192 | 11/1971 | Hoffken | 221/220 |
| 4,494,902 | 1/1985 | Kuppens et al. | 221/74 X |
| 4,606,117 | 8/1986 | Takahashi et al. | 29/759 X |
| 4,657,158 | 4/1987 | Faes et al. | 221/81 X |
| 4,740,136 | 4/1988 | Asai et al. | 414/416 X |
| 4,838,452 | 6/1989 | Hamilton et al. | 221/211 X |
| 4,850,780 | 7/1989 | Safabakhsh et al. | 221/74 X |
| 4,952,113 | 8/1990 | Fujioka | 414/416 |

FOREIGN PATENT DOCUMENTS 957717 2/1957 Fed. Rep. of Germany ........ 221/74

Primary Examiner—David A. Bucci
Attorney, Agent, or Firm—Fidelman & Wolffe

[57] ABSTRACT

A feeder mechanism for a pick-and-place machine with an adjustable shutter mechanism is disclosed. The components are contained within pockets formed in a reeled tape. The shutter mechanism includes a pair of spring blades that cover the pocket, but are spread apart by the vacuum tip when the spindle is lowered. In this way, the shutter can maintain the component in the proper position for pick-up while allowing the vacuum spindle to access the component, which, in turn, maintains proper attitude of component while the blades are retracted.

8 Claims, 3 Drawing Sheets

ADJUSTABLE SHUTTER FOR CONTAINMENT OF ELECTRICAL COMPONENTS IN TAPE FEEDERS

This application is a continuation-in-part of U.S. application Ser. No. 07/337,856, filed Apr. 14, 1989, now abandoned.

The present invention is directed to a tape feeder for feeding small electronics components to a pick and place machine for placement on a circuit board and, in particular, to such a tape feeder having an adjustable shutter for containing the component prior to being picked-up.

BACKGROUND OF THE INVENTION

In conventional tape feeders for pick and place machines, the components are typically stored in pockets in reeled tape. A cover or shutter seals each components in its pocket. In these typical tape feeders, the shutter that contains the part during transport of the tape is opened to expose the parts for pick-up by a vacuum tip shortly after indexing. In high speed applications (on the order of 50 milliseconds for 4 millimeters of index length), the part becomes unstable and oftentimes changes attitude or completely flips over in its surrounding pocket after the shutter is opened. This, of course, makes it difficult or impossible to retrieve the component.

To overcome these disadvantages, a flat shutter was developed, as seen in U.S. Pat. No. 4,740,136. An access slot or notch with a width narrower than that of the chip and wider than that of the vacuum tip is formed in the flat shutter. A vacuum tip fits through the access slot to hold the component at the proper attitude for pick-up. Once the chip is captivated, the shutter is withdrawn and the chip is lifted from the pocket. However, this device has the disadvantage that it requires the tip to have a smaller cross-sectional area than the surface area of the upper face of the chip. Therefore, extremely small chips cannot be handled with this device.

Another shutter mechanism is shown in application Ser. No. 07/127,991, now U.S. Pat. No. 4,838,452 commonly assigned herewith, the contents of which are incorporated herein by reference. The device disclosed in this application uses a finger projecting from the pick-and-place head. The finger engages a shutter actuating lever, which laterally displaces the shutter to provide access to the component.

SUMMARY OF THE INVENTION

The present invention overcomes the above disadvantages by providing a shutter that permits the spindle to hold the components in position for pick-up before the shutter is withdrawn. The shutter includes a pair of spring blades that are opened by the spindle tip to create an access slot to the pocket that holds the component. Once the component is firmly held in position by the spindle. The shutter is withdrawn or displaced in order to remove the component.

This arrangement is advantageous in that it allows the tip of the pick-up spindle to be slightly larger than the component, while preventing the component from changing attitude. Of course, the present invention may be used to pick-up components that are the same size or larger than the spindle tip. Another advantage of this arrangement is that the shutter acts as a guide for the spindle to prevent any inadvertent movement of the spindle. A further advantage of this arrangement is that the vacuum may be switched on prior to contacting the tip to the component, since the shutter maintains the component in a balanced position and acts as an escapement mechanism that holds the component stable.

DETAILED DESCRIPTION OF THE PREFERRED EMBODIMENTS

Figure 1:
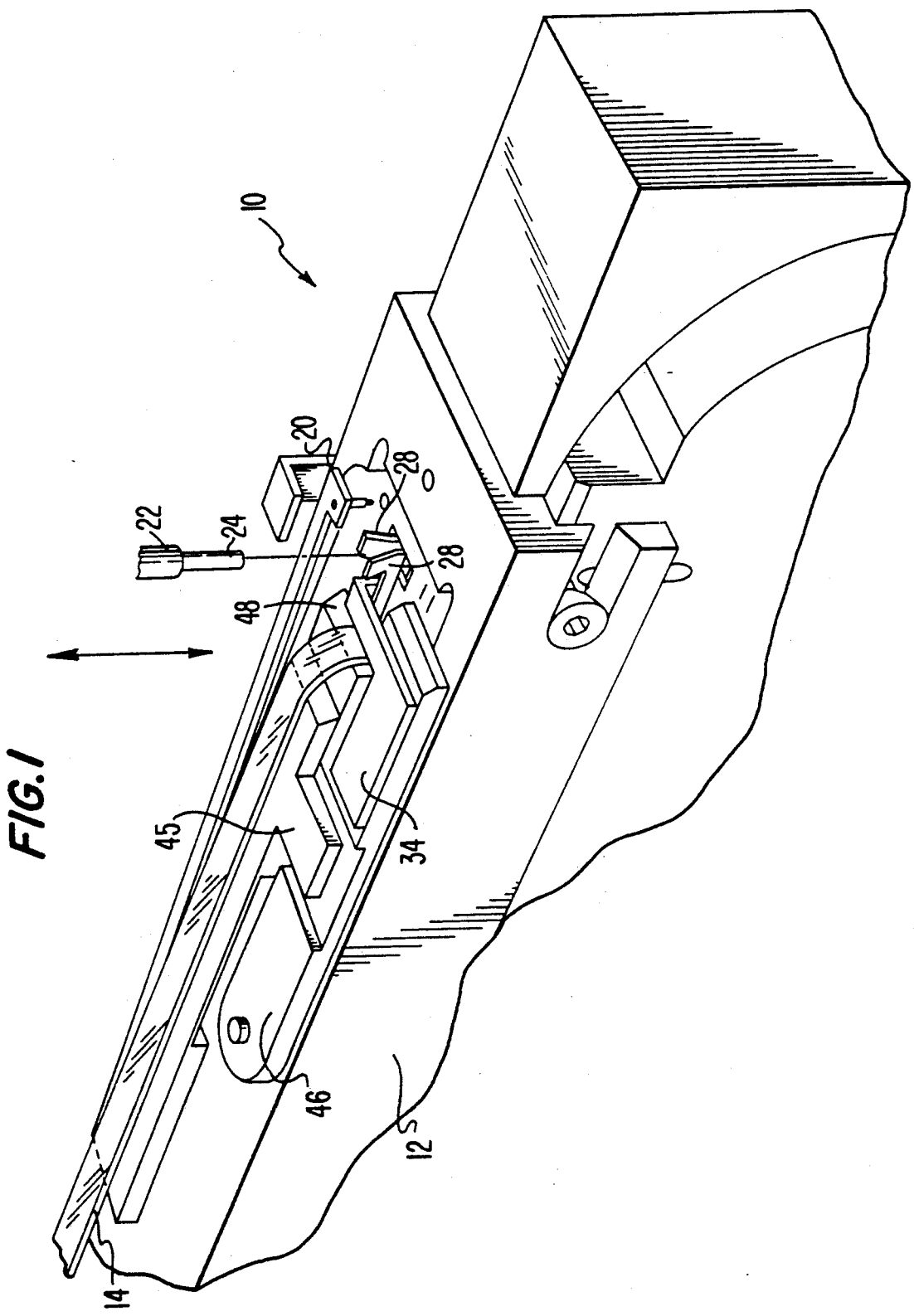
FIG. 1 shows a perspective view of the tape feeder device and shutter in accordance with a first preferred embodiment of the present invention.

A first preferred embodiment of the feeder device with shutter mechanism in accordance with the present invention is shown in FIG. 1 and generally designated 10. Throughout the figures, like numerals will be used to designate like elements.

Feeder device 10 includes primary frame 12. The tape includes pockets 16. Each pocket 16 contains an individual small electronic component 15 on the order of 20×30 mils. and larger. The tape further includes indexing holes 18 which cooperate with indexing pins (not shown) and an indexing mechanism (not shown) to supply the tape from a supply reel (not shown) to a take-up reel (not shown) which is located in take-up housing so as to present each of the pockets consecutively to a pick-up position for removal from the pocket and placement on a circuit board. A lock pin 20 holds the tape in position during the return or reset stroke of the indexer. A suitable tape feeder, including an indexing mechanism, is shown in U.S. Pat. No. 4,887,778, commonly assigned herewith, which is incorporated herein by reference.

In the preferred embodiments, a pick-and-place head is used to pick-up the components for placement on the circuit board. The pick-up head includes spindle 22 and vacuum tip 24 connected thereto.

Figure 2:
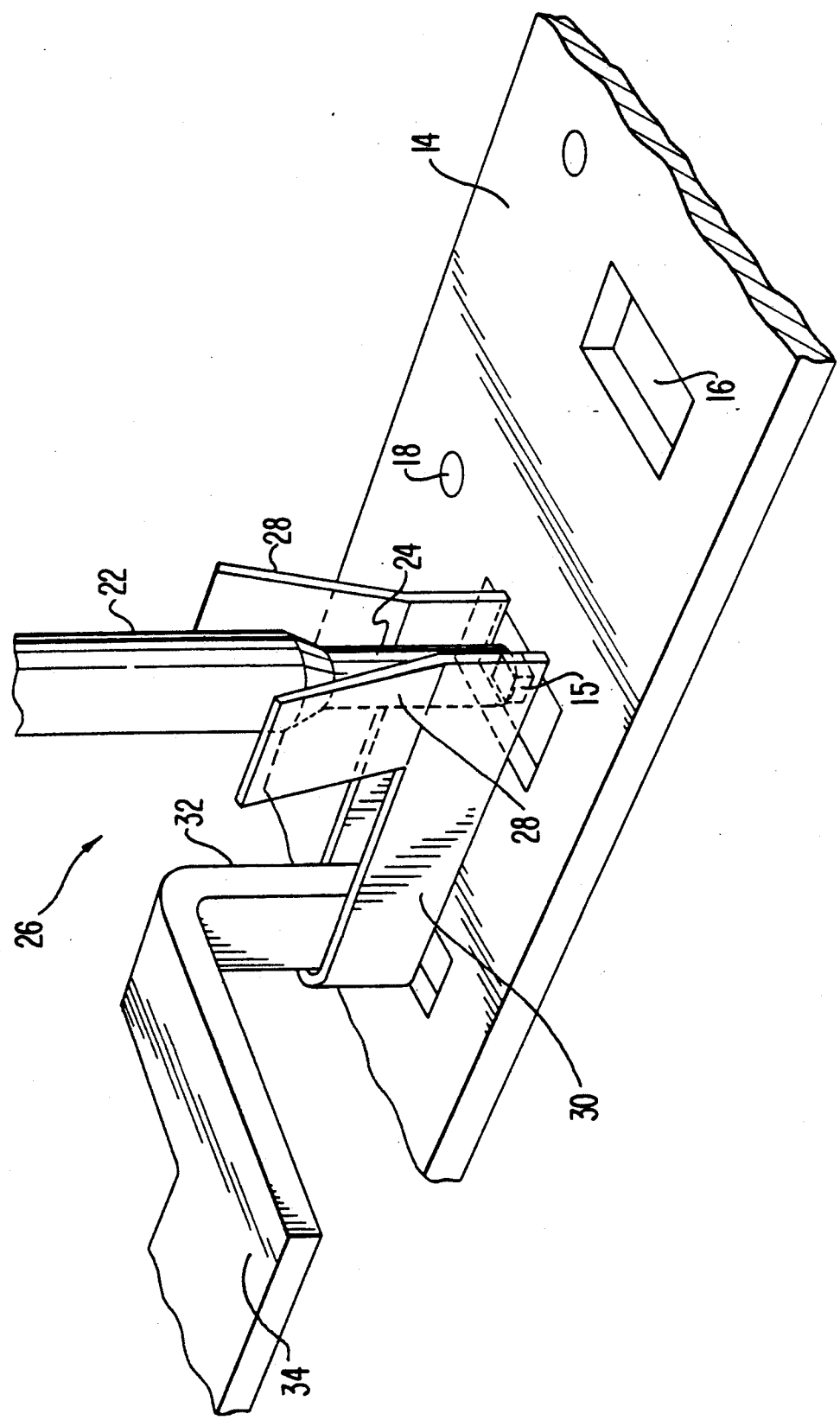
FIG. 2 shows a perspective view of the shutter portion of the device shown in FIG. 1.

As can be seen more clearly in FIG. 2, shutter mechanism 26 includes spring blades 28 formed of a spring material, such as stainless steel. The depth of the spring blades should be sufficient that the blades can be angled to form a tapered arrangement (narrower at the bottom), thus allowing the spindle tip to more easily spread the blades to form an access slot over the component, as will be explained in more detail below.

In this first preferred embodiment, the spring blades are preferably connected via U-shaped connection member 30 which is fitted around downwardly extending portion 32 of pivot bracket 34. The spring blades thus extend upwardly from the ends of the connection member. The pivot bracket can be manually pivoted upwardly to move the shutter mechanism out of the way for servicing of the tape or the like.

In operation, the component supply tape is indexed to present each pocket consecutively at the pick-up station. The top cover 14 has been previously peeled back so that each pocket is opened in turn. As the supply tape is indexed, slide 46 moves axially under cover 45 so that the shutter mechanism 26 is positioned over the pocket at the pick-up position. The vacuum spindle is then lowered so that the tip spreads the blades open. Because the blades grip the spindle, they compensate for any play in the movement of the spindle. The vacuum is then switched on, while the blades maintain the component at its proper attitude. Alternatively, the vacuum may be switched on prior to lowering the tip. The cover tape 14 is pulled in a direction opposite to the pick-up position. As the cover tape is pulled, it acts upon leading edge 48 of slide 46, thus causing attached spring blades 28 to move axially to disengage from the spindle tip 24. The vacuum tip is then raised to withdraw the component from the tape. In this way, the device of the present invention permits the spindle to easily pick-up components that are smaller in cross-sectional area than the vacuum tip itself, as clearly shown in FIG. 2.

Figure 3:
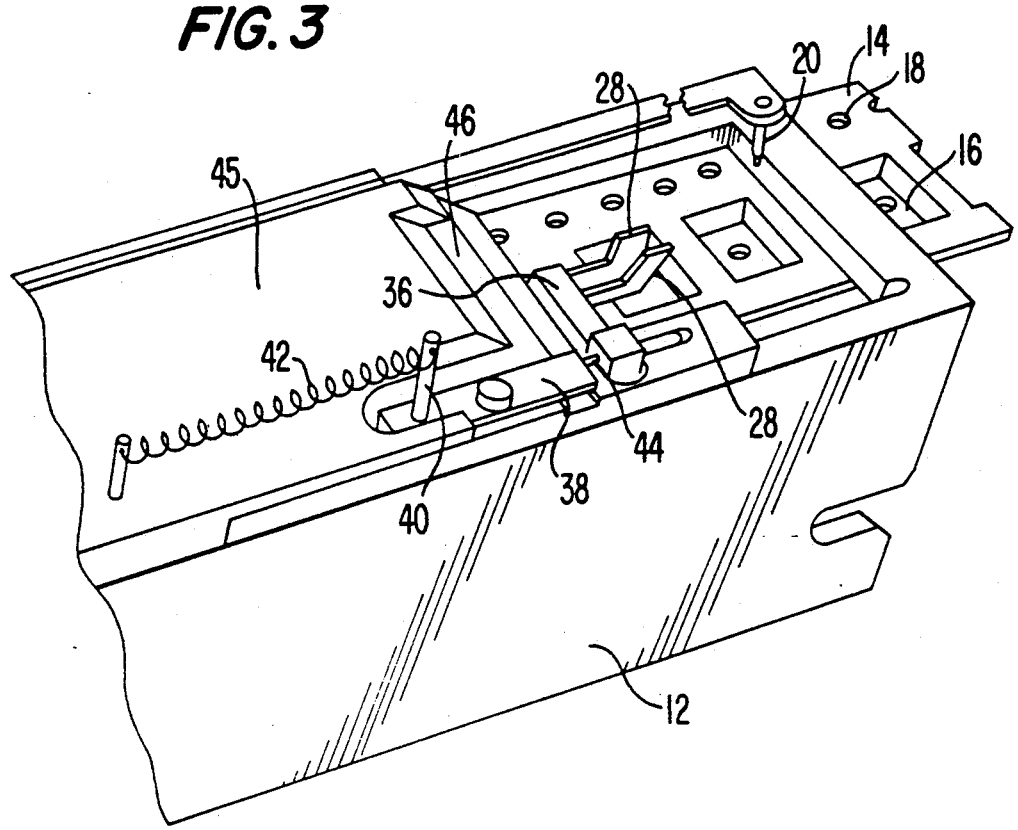
FIG. 3 shows a perspective view of the shutter in accordance with a second preferred embodiment of the present invention.
Figure 4:
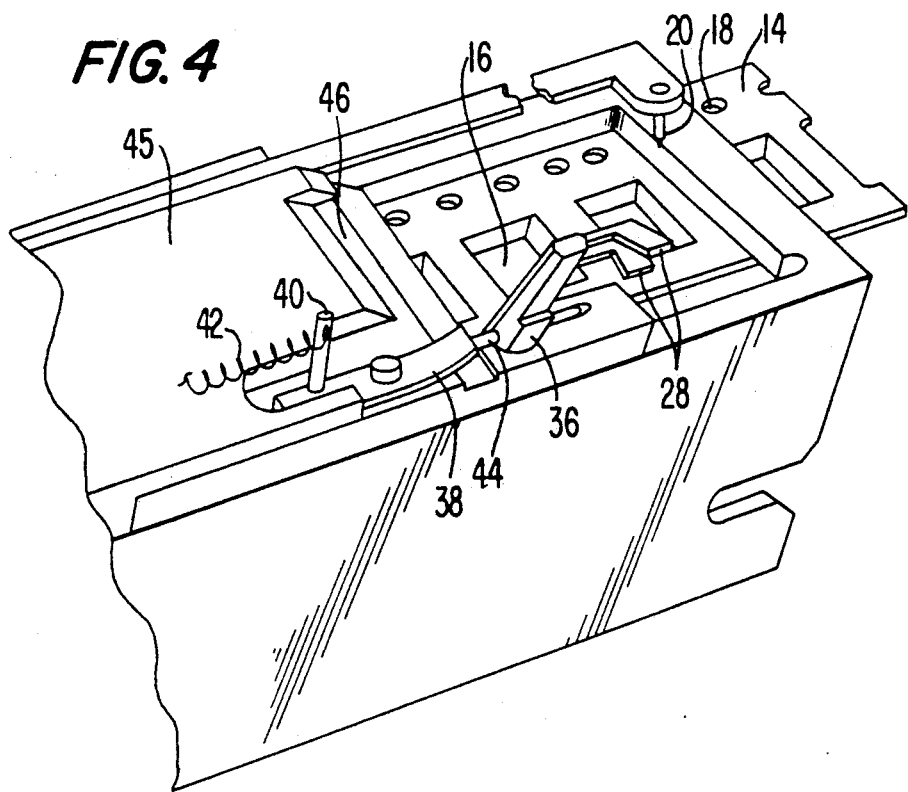
FIG. 4 shows a perspective view of the shutter shown in FIG. 3, with the shutter withdrawn to permit installation of a fresh reel of components.

A second preferred embodiment of the feeder device and shutter mechanism in accordance with the present invention is shown in FIG. 3. This embodiment of the invention uses spring blades 28, as in the first preferred embodiment, connected to one end of flip mechanism 36. Flip mechanism 36 is preferably bar-shaped, although other suitable shapes may be used. The other end of the flip mechanism is coupled to flat spring 38.

Flip mechanism 36 is operably coupled to pin 44 which extends to underneath flat spring 38. The pin has flattened sides so that, when the flip device is manually pivoted upwardly to permit changing or servicing of the component supply tape, the flattened sides co-act with the underside of the flat spring to maintain the flip device in its working position.

The flat spring 38 is connected at its other end via pin 40 and screw 47 to slide 46 held in place by cover 45. Slide 46 is moved to its forward position during indexing of supply tape 18 so that blades 28 are positioned over the pick-up station. After spindle 22 is lowered so that tip 24 is engaged with blades 28 and the top of component 15, slide 46 is caused to move axially by cover tape 14 and/or tension spring 42 connected to pin 40. In this way, the shutter can be moved axially out of the way to permit pick-up of components having an upper surface area greater than the cross-sectional area of the vacuum tip.

The foregoing is for illustrative purposes only. Modifications can be made, particularly with regard to size, shape and arrangement of parts, within the scope of the invention as defined by the appended claims. For example, it is envisioned that the blades and the connector member of the shutter mechanism can be coplanar and both angled so that no upstanding blade portions are necessary.

I claim:

1. A shutter device for use in conjunction with a pick and place device for high-speed handling of electronic components contained within pockets along a component supply tape so that the components are maintained at a proper attitude within the pockets for pick-up, said shutter device comprising:
    a pair of upwardly extending spring blades, said spring blades being openable by a vacuum tip having a known cross-sectional surface area so as to form an access slot through which the vacuum tip can access the component for pick-up while said spring blades maintain the component at the proper attitude within the pocket until the shutter device is removed; and
    a connecting means for connecting said spring blades to each other, said connecting means being moveable in an axial direction parallel to the tape;
    wherein when picking-up components having an upper face surface area greater than the cross-sectional surface area of the vacuum tip, said connecting means is moved axially out of the way once the vacuum tip has gripped the component.

2. A device as in claim 1, wherein said spring blades are disposed at an angle to facilitate ease in inserting the vacuum tip therebetween.

3. A device as in claim 1, wherein said spring blades are formed of stainless steel.

4. A device as in claim 1, further comprising withdrawal means including a pivot bracket having a downwardly extending portion coupled to said connector means and said pivot bracket can be manually pivoted upwardly to maintain said spring blades in an upright position for servicing or replacement of the component supply tape.

5. A device as in claim 4, wherein said connector means is substantially U-shaped and one of said spring blades extends upwardly from each end of said connector means.

6. A device as in claim 1, wherein the vacuum tip has a cross-sectional area greater than the surface area of the upper face of the component.

7. A shutter device for use in conjunction with a pick and place device for high-speed handling of electronic components contained within pockets along a component supply tape so that the components are maintained at a proper attitude within the pockets for pick-up, said shutter device comprising:
    a pair of upwardly extending spring blades, said spring blades being openable by a vacuum tip having a known cross-sectional surface area so as to form an access slot through which the vacuum tip can access the component for pick-up while said spring blades maintain the component at the proper attitude within the pocket until the shutter device is removed;
    a connecting means for connecting said spring blades to each other, said connecting means being movable in an axial direction parallel to the tape, said connecting means having a flip bar; and
    a withdrawing means operable coupled to said connector means for withdrawing said connecting means and said spring blades, wherein said withdrawal means is a flat spring and said flip bar is operably connected to said flat spring via a flattened pin, said pin co-acting with a bottom surface of said flat spring when said flip bar is pivoted downwardly to maintain said flip bar and said spring blades in working position;
    wherein when picking-up components having and upper face surface area greater than the cross-sectional surface area of the vacuum tip, said connecting means is moved axially out of the way once the vacuum tip has gripped the component.

8. A feeder device for high-speed feeding of electronic components contained within pockets of a reeled tape which is indexed to present each pocket and the component therein sequentially to a pick-up station, each component having an upper face, said device comprising:
    a shutter means for covering said pocket at said pick-up station, said shutter means including a pair of upwardly extending spring blades; and
    a movable pick-up head means for opening said shutter means sufficiently to access the component prior to removal from the pocket said pick-up head means having a cross-sectional tip surface area greater than or equal to the surface area of the upper face of the component.

* * * * *